United States Patent [19]

Clow et al.

[11] 4,315,216
[45] Feb. 9, 1982

[54] IMAGING SYSTEMS

[75] Inventors: Hugh Clow, Reading; Peter E. Walters, Southall, both of England

[73] Assignee: E M I Limited, Hayes, England

[21] Appl. No.: 39,650

[22] Filed: May 16, 1979

[30] Foreign Application Priority Data

May 25, 1978 [GB] United Kingdom ............... 22292/78

[51] Int. Cl.³ ............................................. G01N 27/00
[52] U.S. Cl. ..................................... 324/309; 324/307
[58] Field of Search ................ 324/309, 300, 307, 312

[56] References Cited

U.S. PATENT DOCUMENTS 3,778,614 12/1973 Hounsfield .
3,924,129 12/1975 Gordon .
3,932,805 1/1976 Abe ..................................... 324/309
4,021,726 5/1977 Garroway ........................... 324/309

OTHER PUBLICATIONS

Proton Spin Imaging by Nuclear Magnetic Resonance, Mansfield, Contemp. Phys., 1976, vol. 17, No. 6, pp. 553-576.

Primary Examiner—Michael J. Tokar
Attorney, Agent, or Firm—Fleit & Jacobson

[57] ABSTRACT

Nuclear magnetic resonance (NMR) apparatus have beenproposed for examining slices or volumes of bodies, perhaps for medical examination of patients. Magnetic fields are used to induce resonance in a selected region of a body and a resonance signal is detected during a pulse of a gradient field which causes phase dispersion across the region.

It is now proposed that more efficient operation of the apparatus is possible if the gradient pulse is a non-square pulse, perhaps a distorted sinusoid, and the resonance signal is sampled during that pulse at intervals such that $\int Hdt$ is substantially equal between adjacent samples.

16 Claims, 15 Drawing Figures

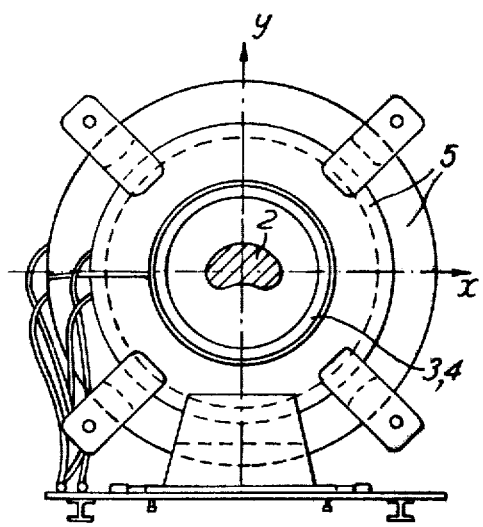
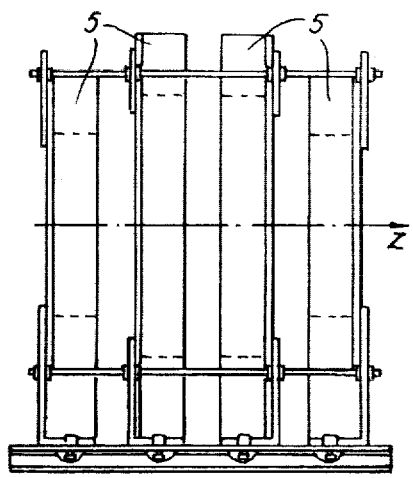
FIG.4a   FIG.4b
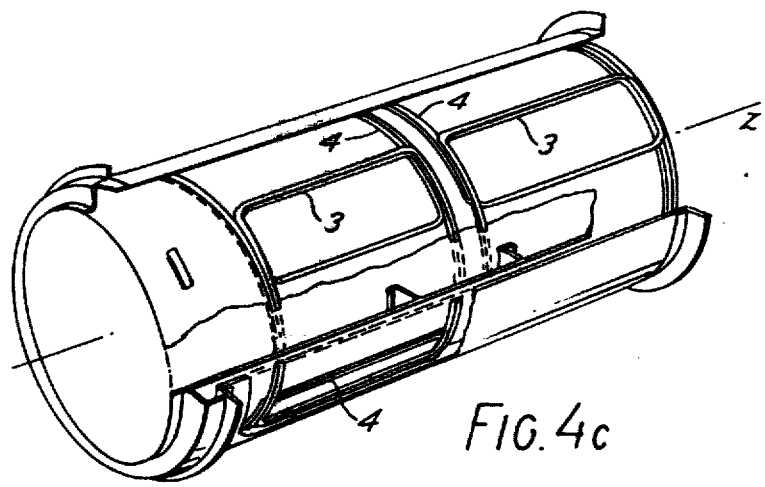
FIG.4c

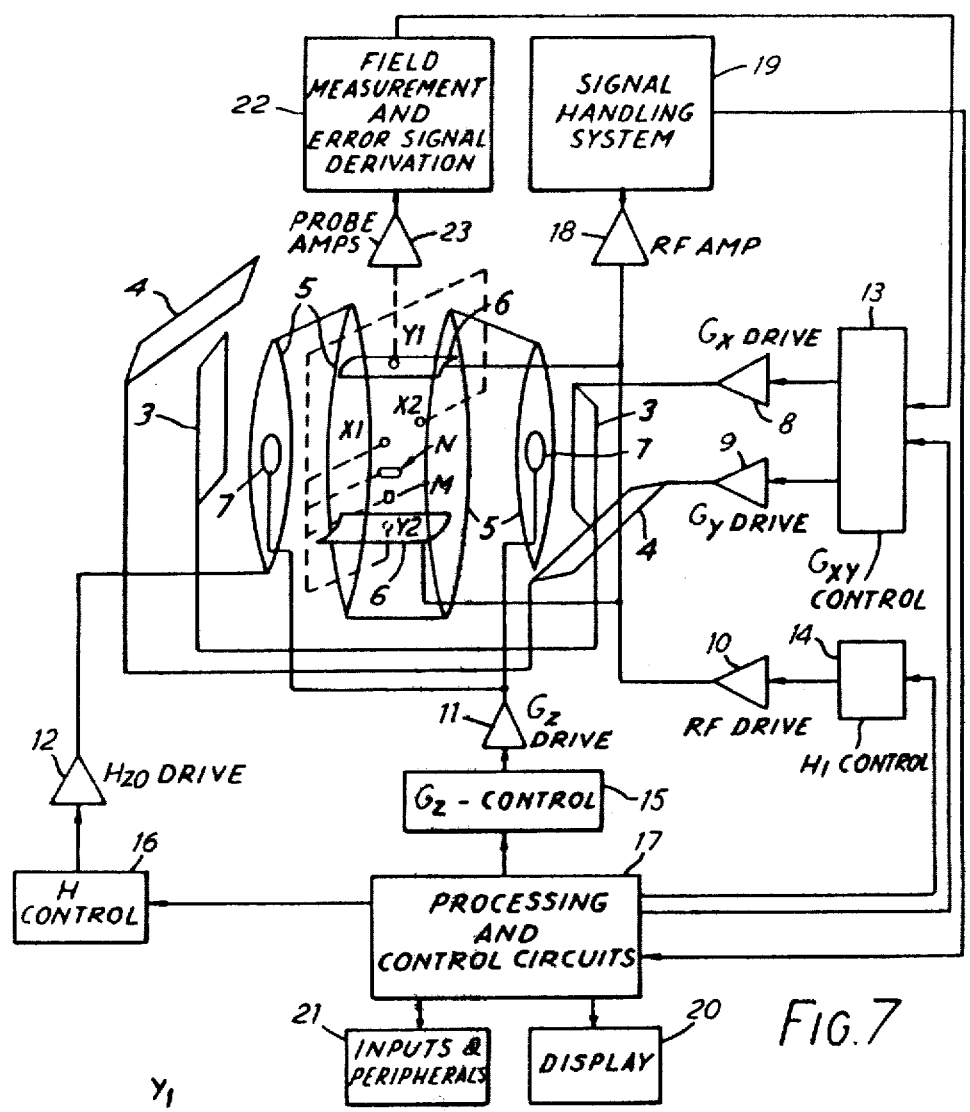
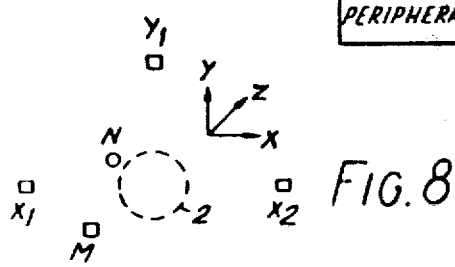
FIG.7
FIG.8

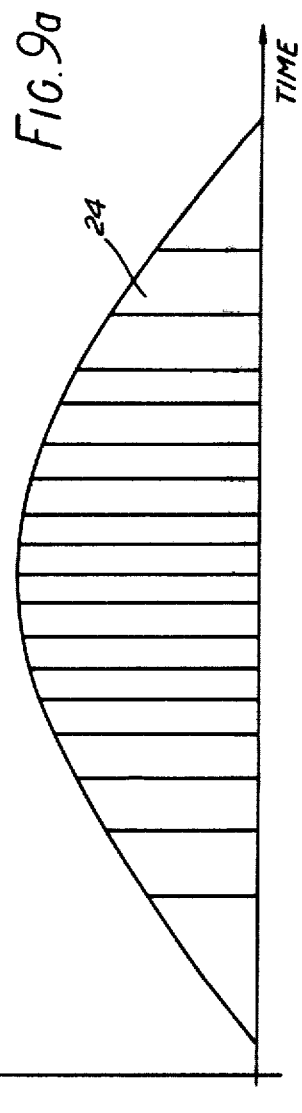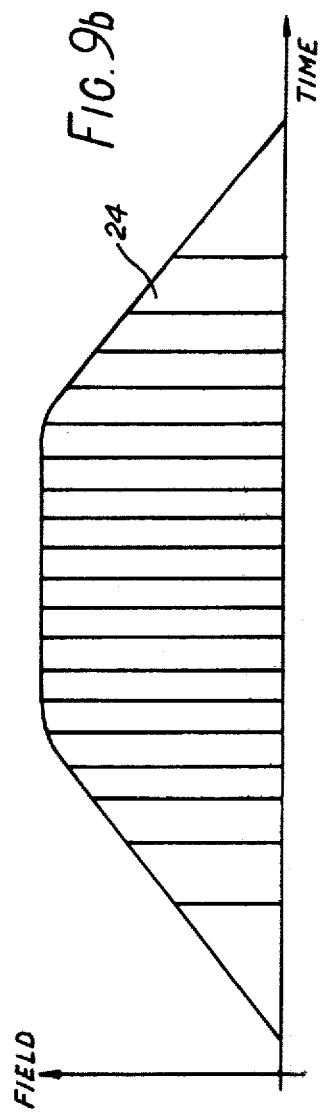

IMAGING SYSTEMS

The present invention relates to systems for providing images of distributions of a quantity, in a chosen region of a body, by gyromagnetic resonance, particularly nuclear magnetic resonance. Such techniques may be used for examining bodies of different kinds. However, a particularly beneficial application is the examination of patients for medical purposes.

Nuclear magnetic resonance is known for the analysis of materials, particularly by spectroscopy. Recently it has been suggested that the techniques be applied to medical examination to provide distributions of water content or relaxation time constants in sectional slices or volumes of patients. Such distributions are similar to, although of different significance from, the distributions of X-ray attenuation provided by computerised tomography systems.

Practical NMR systems operate by applying suitable combinations of magnetic fields to the body being examined, via coil systems, and detecting induced currents in one or more detector coil systems. A suitable sequence of pulsed magnetic fields and apparatus to operate that sequence have been devised and are the subject of the United States patent applications.

It is an object of this invention to provide an improvement to the systems described therein.

According to one aspect of the invention, there is provided an NMR apparatus, for examining a slice of a body, the apparatus including:
  means for applying magnetic fields to cause resonance preferentially in said slice;
  means for applying a pulsed magnetic field having a gradient across the slice to produce phase dispersion in said resonance, the said means being arranged to cause a pulse which is not square; and
  means for sensing a resonance signal induced during said pulsed field; wherein control means are provided for causing the means for sensing to sample the induced signal at intervals such that the field integral for the pulsed field is substantially the same between each successive pair of samples.

According to another aspect of the invention, there is provided a method of examining a slice of a body by nuclear magnetic resonance, including the steps of: applying magnetic fields to induce resonance preferentially in said slice, applying magnetic fields, including a pulsed field having a gradient across the slice in one direction, to cause phase dispersion of said resonance and sampling a resonance signal in the slice, wherein for a gradient field pulse which is not a square pulse, the resonance signal is sampled at intervals such that the field integral for the pulsed gradient field is substantially the same in each of said intervals.

According to yet another aspect of the invention there is provided a nuclear magnetic resonance apparatus, for examining a region of a body, the apparatus including:
  means for applying magnetic fields to cause resonance preferentially in said region;
  means for applying a magnetic field having a gradient in a chosen direction in said region to produce phase dispersion in said resonance;
  means for sensing a resonance signal induced during the application of said gradient magnetic field; and
  control means for causing the means for sensing to sample the induced signal at intervals such that the field integral with respect to time of the gradient magnetic field is substantially the same in each interval between successive samples when the amplitude of the gradient magnetic field varies during said sampling.

In order that the invention may be clearly understood and readily carried into effect, it will now be decribed by way of example with reference to the accompanying drawings, of which:

Figure 5:
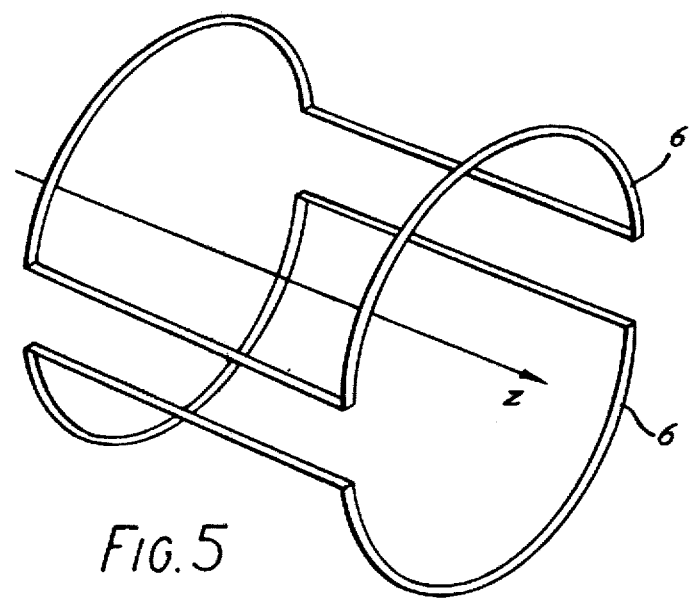
Figure 6:
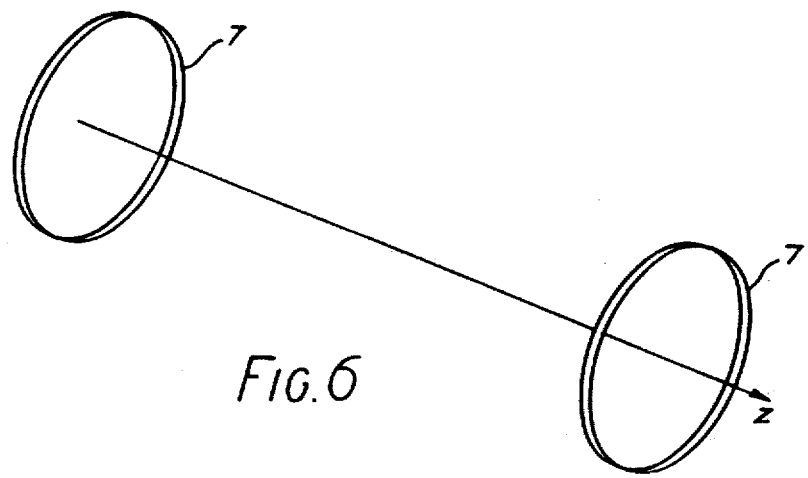
Figure 10:
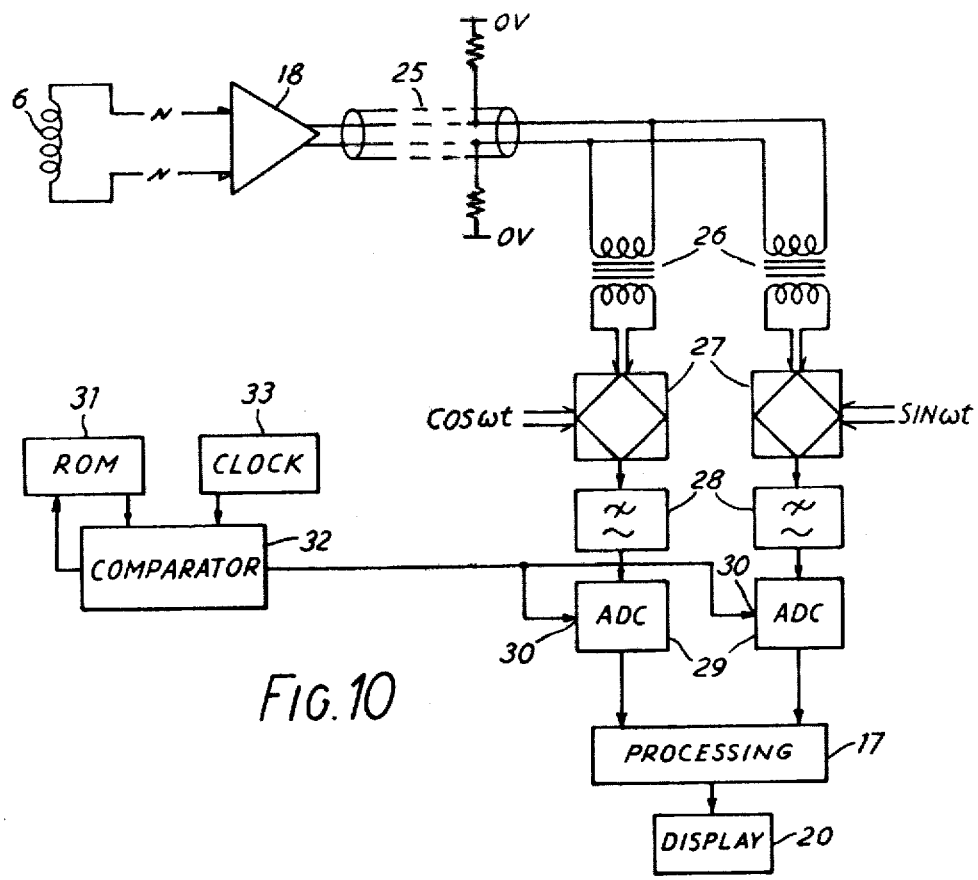
Figure 11:
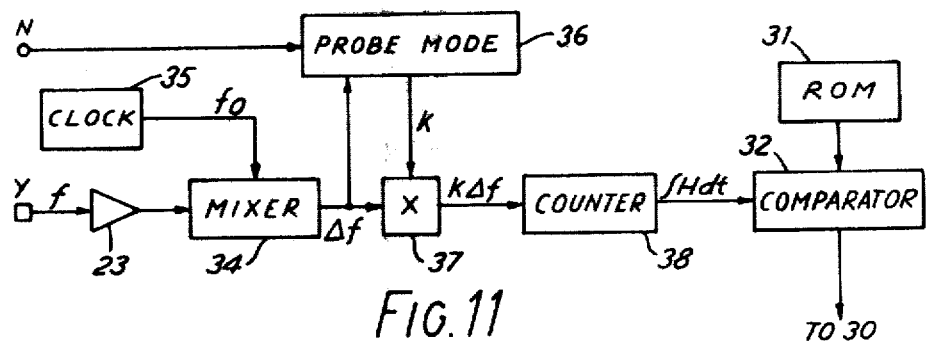

FIGS. 4a, 4b and 4c show in three views the $H_{zo}$, $G_x$ and $G_y$ field coils, of a practical NMR machine, FIG. 5 shows the $H_1$ field coils of that machine, FIG. 6 shows the $G_z$ gradient field coils of that machine, FIG. 7 shows a block diagram of the complete NMR apparatus, FIG. 8 shows a disposition of field sensing probes for the apparatus, FIGS. 9a and 9b show the sampling periods in accordance with the invention for two practical gradient pulse shapes, FIG. 10 shows the signal recovery circuits and FIG. 11 shows a variation of part of the circuits of FIG. 10.

For the examination of a sample of biological tissue NMR primarily relates to protons, (hydrogen nuclei) of water molecules in the tissue. In principle, however, other nuclei could be analysed; for example, those of deuterium, tritium, fluorine or phosphorus.

The nuclei each have a nuclear magnetic moment and angular momentum (spin) about the magnetic axis. If then a steady magnetic field is applied to the sample, the nuclei align themselves with the magnetic field, many being parallel thereto and some being anti-parallel so that the resultant spin vector is parallel to the field axis. For this examination procedure the steady field is aligned with an axis of the system which will be identified as the z-axis. The field is thus identified as $H_{zo}$, where all fields aligned with the z-axis are identified as $H_z$.

The nuclei have a characteristic frequency (known as the Larmor frequency) which is determined by the local value of the steady magnetic field, i.e. $H_{zo}$. Application of an additional field $H_1$ which is an R.F. field at the Larmor frequency, in a plane normal to $H_{zo}$, causes resonance at that frequency so that energy is absorbed in the sample. The resultant spin vectors of nuclei in the sample then rotate from the magnetic field axis (z-axis) towards the plane orthogonal thereto (x,y). The R.F. field is generally applied as a pulse and if $\int H_1 dt$ for that pulse is sufficient to rotate the resultant spin vectors through 90° into the x, y plane the pulse is termed a 90° pulse.

On removal of the $H_1$ field the equilibrium alignments reestablish themselves with a time constant $T_1$, the spin-lattice relaxation time. In addition, a proportion of the absorbed energy is re-emitted as a signal which can be detected by suitable coils, at the resonant frequency. This free resonance signal decays with a time constant $T_2$ and the emitted energy is a measure (for protons) of the water content of the sample.

As far described, the resonance signal detected relates to the entire sample. If individual resonance signals can be determined for elemental samples in a slice or volume of a patient then a distribution of proton densities, in effect of water content, can be determined for that slice or volume. Additionally, or alternatively, it is possible to determine a distribution of $T_1$ or $T_2$.

In general, the principles of analysing proton density by NMR in a slice of a body have been extensively discussed. The known techniques have been reviewed by P. Mansfield in Contemp. Phys. 17 (b) 1976, 553–576. Consequently, the techniques will only be discussed in detail herein to the extent necessary to understand the improved arrangement of this invention.

In the embodiment discussed herein, the examination is particularly of a cross-sectional slice of the patient, although examination of a larger volume is possible at least by examination of a plurality of adjacent slices, or by a specifically volume scan.

Figure 1:
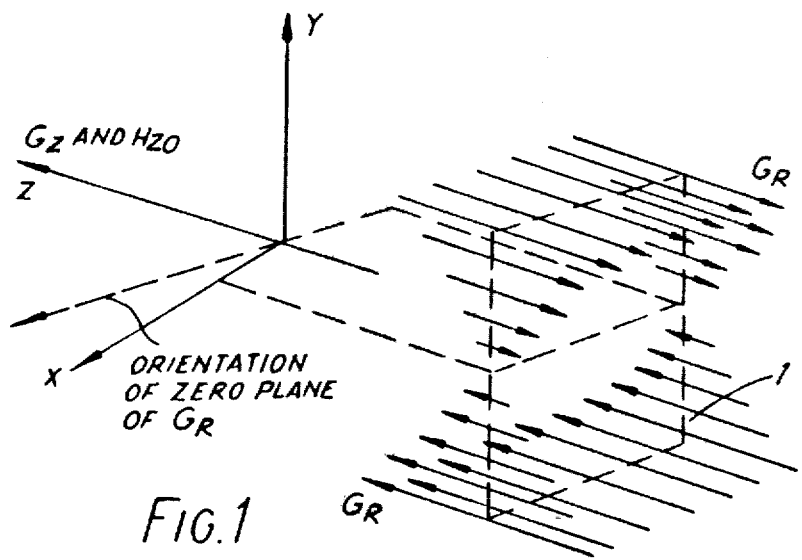
FIG. 1 shows the form of the $G_R$ gradient field.
Figure 2:
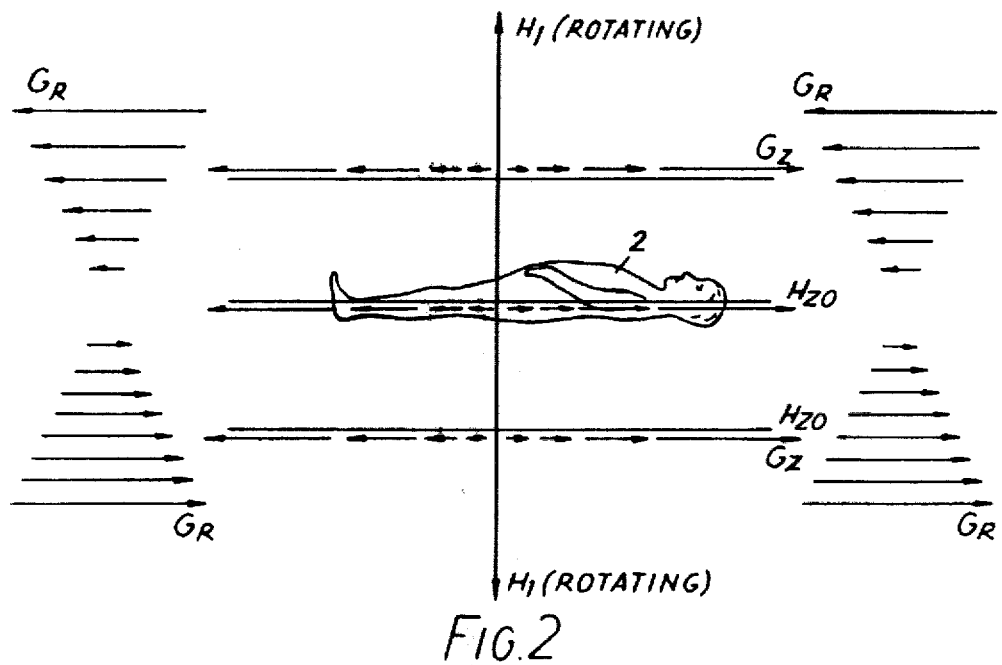
FIG. 2 shows the relationship of the $G_R$ gradient field to the other fields.

The first step is to ensure as far as possible that resonance occurs (at the chosen frequency) only in the selected slice. Since the resonance frequency (the Larmor frequency) is related to the value of the steady magnetice field, the slice selection is achieved by adding a gradient field to $H_{zo}$ so that the local field is of different magntitude in different slices of the patient. The steady and uniform $H_{zo}$ field is applied as before, usually longitudinal to the patient. Additional magnetic gradient field $G_z$ is also applied ($G_z = \partial H_z / \partial z$). If then the pulsed $H_1$ field is applied at the appropriate frequency, resonance only occurs in that slice in which the resonance frequency, as set by $H_{zo}$ and the local value of $G_z$, is equal to the frequency for $H_1$. If the $H_1$ pulse is a 90° pulse, it brings the spin vectors into the x, y plane substantially only for the resonant slice. Since the value of the field is only significant during the $H_1$ pulse, it is only necessary that $G_z$ be applied when $H_1$ is applied, and in practice $G_z$ is also pulsed. The $H_1$ and $G_z$ fields are therefore then removed. It is still, however, possible to change the resonant frequencies of the spin vectors which are now in the x, y plane. This is achieved by applying a further gradient field $G_R$ ($G_R = \partial H / \partial R$) which is parallel to $H_{zo}$. The intensity of $G_R$, however, varied from a maximum at one extreme of the slice, through zero in the centre to a maximum in the reverse direction on the opposite surface. The $G_R$ field is illustrated in FIG. 1, the arrows indicating only magnitudes at points on a rectangle 1. There will, of course, be a smooth variation through and between the magnitudes illustrated. The fields are also illustrated diagrammatically in the side elevation of FIG. 2 in relation to a patient 2. Correspondingly, the resonant frequencies will vary smoothly across the slice from one side to the other.

As mentioned before, the signal which now occurs is at the resonant frequency. Consequently, the signals received from the slice will also have frequencies which vary across the slice in the same manner. The amplitude at each frequency then represents inter alia the proton density in a corresponding strip parallel to the zero plane of $G_R$. The amplitude for each strip can be obtained by varying the detection frequency through the range which occurs across the slice. Preferably, however the total signal at all frequencies is measured. This is then Fourier analysed by well known techniques to give a frequency spectrum. The frequency appropriate to each strip will be known from the field values used and the amplitude for each frequency is given by the spectrum.

As discussed, for the gradient field $G_R$ illustrated in FIG. 1, the individual signals derived from the frequency spectrum, for increments of frequency, correspond to incremental strips parallel to the zero plane of $G_R$. These signals are similar in nature to the edge values derived and analysed for X-ray beams in computerised tomography (CT). The X-ray edge values are obtained for sets at a plurality of different orientations in an examined slice and then are processed by a suitable method, such as that described in U.S. Pat. No. 3,778,614 or the further development thereof described in U.S. Pat. No. 3,924,129.

It will be apparent that by changing the orientation, relative to the x, y plane, of the zero plane of $G_R$, further sets of signals can be obtained representing proton densities along lines of further sets of parallel lines at corresponding further directions in the examined slice. The procedure is therefore repeated until sufficient sets of "edge values" have been derived to process by methods like those used in CT for sets of X-ray beams. In practice, the $G_R$ field is provided by combination of two gradient fields $G_x$ and $G_y$, which are both parallel to $H_{zo}$ but have gradients in orthogonal directions. The direction of the gradient of the resultant $G_R$ is therefore set by the relative magnitudes of $G_x$ and $G_y$. At many points in the following description reference will be made to the creation of $G_R$ field pulses and it should be remembered even where $G_x$ and $G_y$ gradient fields are not individually discussed that reference is to the resultant of $G_x$ and $G_y$ field pulses.

Figure 3A:
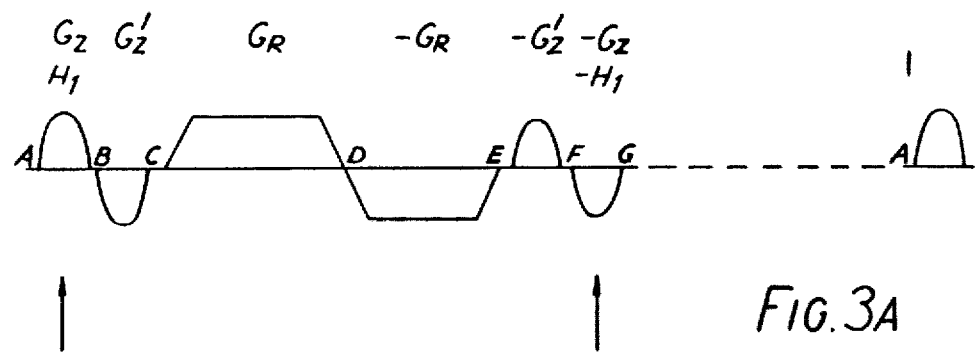
FIG. 3a shows the preferred field pulse sequence.
Figure 3B:
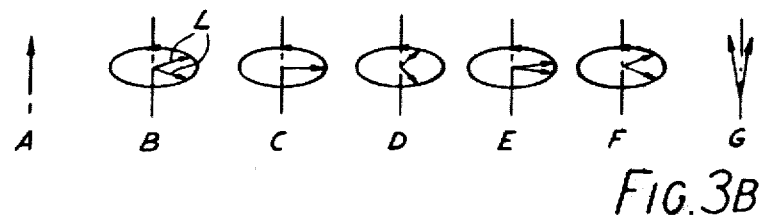
FIG. 3b shows the effects of the pulses of FIG. 3a on the proton spin vectors.

The full examination for one direction of the $G_R$ gradient is achieved by applying, via appropriate coils, the sequence of field pulses shown in FIG. 3a. FIG. 3b shows the effect which each pulse has on the spin vector. It will be realised that the $H_1$ field is a rotating field about the z-axis. Correspondingly, the spin vectors thereafter precess about the z-axis. For clarity of explanation, the spin vectors are shown in FIG. 3b on a coordinate system which rotates with $H_1$.

Referring to FIGS. 3a and 3b together, the pulse cycle comprises six phases, AB to FG, and a recovery period shown by the broken line. The $H_{zo}$ field is continuously present throughout the cycle.

Prior to the first pulse, or after the recovery period if an earlier cycle has been implemented, the mean spin moments are substantially aligned with the z-axis (A).

The gradient field $H_z$ pulse and $H_1$ pulses simultaneously applied, (AB), respectively select the slice and bring the resultant spin moments into the x, y plane (still, of course, precessing about the z-axis). Although the resonant frequency is the same throughout the slice selected, there is a phase dispersion introduced because the excitation occurred in a field gradient. Thus the spin moments are shown at B, though dispersed between limits much greater than can be satisfactorily illustrated. The limits shown at L are merely indicative of the nature of the dispersion. It has been found that this phase dispersion can be reversed by the application of a negative field gradient pulse, that is a pulse of the correct relative magnitude to $G_z$ but 180° displaced (in practice the magnitude is about 57% of $G_z$). This pulse BC is therefore applied to bring the spin moments in the x, y plane into phase as at C. The $H_1$ field need not be continued into the negative gradient pulse ($G_z'$) but it can be continued during that pulse if required to ensure that the spin moments go into the x, y plane.

At that time a signal could be sensed to give proton density for the whole slice. However, in this sequence, the signal is sensed in the presence of a $G_R$ pulse CD which gives frequency dispersion in a selected direction (r) in the slice as previously described. The change to the new frequencies is almost instantaneous with the application of the $G_R$ pulse and is maintained proportionately throughout the pulse. As discussed, the signal is sensed and frequency analysed to give the proton densities for a plurality of adjacent parallel strips of the slice. After the $G_R$ pulse the spin moments, which are still largely in the x, y plane despite some relaxation, have a considerable phase dispersion as shown at D (which is illustrative—as the actual dispersion is $n\pi$ radians (n being 100 or more)). At that stage, if a further cycle as described so far were to be required, it would be necessary to wait for spin—lattice relaxation to realign the spin moments with the z-axis. This could take as much as 5 seconds which, since several hundred or perhaps several thousand of cycles are required, is much too long.

It is proposed to return the spin moments substantially back to the starting position (A) by repeating the pulse sequence up to D in the reverse order and reverse sense. Since the $-G_R$ is substantially the same as the $G_R$ pulse except for its sense, further signals may be detected during it. These will be for the same r direction as for the forward pulse and help to improve the signal to noise ratio.

After the reverse pulse sequence the spin moments still show some deviation from the z-axis due to phase dispersion caused by spin-spin coupling. This canot be reversed by this pulse sequence, nor it is believed by any other. The period GA therefore allows some relaxation to thermal equilibrium (time constant $T_1$) which eliminates the effect of the phase dispersion and also reduces the effects of any mismatching between the forward and reverse pulses. Although the relaxation period GA is still necessary, the use of the reversed pulse sequence D to G has much reduced that period and allows faster repetition of the total sequence for other r-directions. The length of the signal measurement period CE is determined by the phase dispersion caused by $H_{zo}$ field inhomogeneity and also by the dispersion caused by spin-spin coupling. If the effect of $H_{zo}$ field inhomogeneity is considered to excessively shorten the period CE then pulse FG may be a 180° r.f. pulse rather than a 90° pulse. Turning the spin moments through 180° produces a so-called "spin-echo" of known form and the $G_R$ pulses similar to CD and DE can be repeated to give a further signal measurement period. The spin-echo procedure is known to reverse the dispersion due to field inhomogeneity and can be repeated here several times until sufficient signal has been obtained or until spin-spin dispersion, which cannot be reversed, becomes excessive. As in the sequence of FIG. 3A, a spin-echo sequence should end with pulses EF, FG and recovery period GA.

The ratio of period GA to period AG should preferably be approximately the ratio of $T_1$ to $T_2$ for maximum sensitivity. Typically, the total period AGA is 40 m sec where AG is approximately 5.5 m sec, AB is 300μ sec and CD is 2 m sec. The $H_1$ pulse is typically of 0.6 Oe and has a frequency of 4.26 MH$_z$ for an $H_{zo}$ of 1000 O$_e$. All other pulses are at envelope frequencies, $G_z$ being typically +300e to -300e. $G_R$ being 15 Oe to -15 Oe.

In the preferred embodiment $G_z'$ is less than $G_z$; typically $$\int G_z' \, dt = 0.55 \int G_z \, dt \text{ to } 0.6 \int G_z \, dt$$

FIGS. 4a and 4b show in end and side elevation respectively a practical coil arrangement to provide the $H_{zo}$ field. FIG. 4a also shows the coils for production of the $G_R$ field pulses and, to show approximate dimensions, the patient 2 in cross-section. The patient 2 is inserted in the tublar former of $G_R$ coils 3, 4 and is supported there by a suitable couch or other supporting means. Such supports may be readily provided in any suitable form.

The coils 3, 4 are two sets of coils axially displaced, each set comprising two pairs of saddle coils the pair 3 being at 90° to the pair 4. These coils are themselves inserted into the central aperture in $H_{zo}$ coils 5 which are wound in four parts connected in series to provide an approximately circular configuration which is well known to be desirable for production of a uniform field.

FIG. 4c is a partially cut-away perspective view which shows the coils 3, 4 in more detail.

As mentioned hereinbefore, the $G_R$ field pulses are the resultant of $G_x$ and $G_y$ components. The $G_x$ components are provided by the four coils 3 and the $G_y$ components by the four coils 4.

The $H_1$ coils are shown in FIG. 5 in perspective. They are two saddle shaped coils 6 which are driven in parallel to provide the rotating $H_1$ field and which are, in this embodiment, also used to detect the signals which are of approximately the same frequency. It will be understood that in certain circumstances it may be better to duplicate coils to give separate detection coils more specifically matched to detection.

FIG. 6 shows, also in perspective, the two circular coils 7 which provide the $G_Z$ field component for the gradient superimposed on $H_{zo}$.

Further details of the coil windings will not be given since suitable coils can readily be devised, by those with the appropriate skills, to provide the fields required.

FIG. 7 shows in simplified form an NMR apparatus, suitable for medical examination, employing the pulse sequence explained with reference to FIG. 3a.

The coils 3, 4, 5, 6 and 7, which are shown schematically, are those shown hereinbefore in FIGS. 4 to 6. They are driven by $G_x$, $G_y$, RF($H_1$), $G_z$ and $H_{zo}$ drive amplifiers 8, 9, 10, 11 and 12 respectively, controlled by $G_{xy}(G_R)$, $H_1$, $G_z$ and $H_{zo}$ control circuits, 13, 14, 15 and 16 respectively. These circuits can take suitable forms which will be known to those with esperience of NMR equipment and other apparatus using coil induced magnetic fields. The circuits are controlled by circuits 17 to achieve the pulse sequence described or another appropriate one.

The signal sensed during the $G_R$ pulses is detected in the $H_1$ coils 6 and is amplified by an RF amplifier 18 before being applied to signal handling circuits 19. Circuits 19 can make appropriate calibrations but essentially detect signals and transmit them to processing circuits to provide the required representation. The processing circuits carry out Fourier Transformation to provide signals for lines in the examined part of the body and process those line signals, for example as described and claimed in U.S. Pat. No. 3,924,129 (with appropriate changes for NMR rather than X-ray signals).

The processing may be carried out in a suitably programmed digital computer and this may also control the pulse sequence and form the circuits 17. The picture thus obtained is viewed on a display 20, such as a television monitor, and thus may include inputs and other peripherals 21 for the provision of commands and instructions to the machine or other forms of output.

The system also may include field measurement and error circuits 22 which receive signals via amplifiers 23 from field probes $X_1$, $X_2$, $Y_1$, $Y_2$, N and M shown. The positions of the probes, in relation to the examined slice of body 2, is further shown in FIG. 8.

Such probes, of which $X_1$, $X_2$, $Y_1$ and $Y_2$ are YIG (yttrium-iron-garnet) tuned oscillator probes, and N and M are simple NMR probes, are provided in MNR apparatus for various purposes.

The NMR apparatus described so far can be constructed by those with experience in this art to provide the required data for a slice of a patient's body. For sufficiently accurate results to give diagnostically useful information it is, however, desirable, and in some cases important, that factors, in particular the magnetic fields, are precisely maintained. For example, it is desirable that the $H_{zo}$ field should be uniform to around 5 parts in $10^6$ over the examined slice. This uniformity can be affected by the quality of the coils used and by adjacent ferromagnetic materials, which should therefore be kept to a minimum.

Also requiring great precision are the $G_R$ gradient fields, which as discussed before are constructed from $G_x(=G_R \sin \theta)$ and $G_y(=G_R \cos \theta)$ pulses. The $G_R$ gradient vector should be in the desired direction with the least error possible. Furthermore, the $-G_R$ pulse should reproduce in the opposite sense, the preceding $G_R$ pulse. Arrangements for the production of $G_R$ pulses of suitable shape and the required precision are the subject of the U.S. Patent application corresponding to British patent application No. 22295/78 and comprise one use for the said YIG probes and circuits. It is there proposed to provide a continuously operative control system, responsive to field sensitive probes disposed within the coil system, to respond to changes in the measured field. It will be observed that the $G_R$ and $-G_R$ pulses shown in FIG. 3a are flat topped. This is also true of the $G_R$ pulses which have previously been proposed for NMR which have generally been shown as being square. The resonance signal is sampled during the $G_R$ pulses usually for subsequent digital processing. According to established sampling theory, the signal should then be sampled and digitised at regular times intervals. As discussed, the $G_R$ field is providing phase dispersion in the R direction and the sampled signal is Fourier transformed. Thus the rate of sampling determines the phase shift between adjacent strips perpendicular to the R direction in the slice being examined, and therefore the maximum frequency seen in the finally derived picture (i.e. the picture width). The total sampling time determines the resolution limit.

For the square pulse previously proposed, uniform time period sampling gives satisfactorily uniform resolution. However, for the practical flat topped pulse shown in FIG. 3a, the uniform sampling would not be satisfactory at the start and end. For other pulses which may not even be flat-topped, such as sine waves or distorted sine waves used in practice, the uniform time spacing is even less suitable.

This invention is not concerned with the production of the $G_R$ pulse, which may be by any suitable arrangement. It is, however, concerned with the satisfactory sampling of signals provided by NMR apparatus using $G_R$ pulses which are not square.

The sample is a function of $$\int_0^{P_i} H \, dt$$

(for $G_R$) for a series of limits $P_i$ which define the sample points. If $G_R$ is not a square wave, then for regular signal sampling there is introduced the problem of correcting for the actual shape used for $G_R$. This is though to be impossible. However, the use of a gradient waveform which is not a square wave, in a NMR apparatus, can be made invisible to the processing by arranging sampling which is non linear in time but is linear in terms of phase shift. This can be achieved by choosing $P_i$ appropriately.

The invention provides that samples are taken at intervals such that $\int H dt$ in the intervals between adjacent samples is equal. This will not correspond to sampling at equal time intervals except for square pulses.

FIGS. 9a and 9b show how the sampling times are spaced on that basis for two practical pulses. FIG. 9a is a half sine wave, although it should be noted that a real pulse is a distorted half sine wave because of other corrections and adjustments which do not affect this invention. FIG. 9b is a more practical form of flat topped pulse. The sampling points are indicated by vertical lines 34 in both cases. It can be seen that the sampling time varies so that $\int H dt$ can be equal, although the Figures are merely exemplary and are not accurately calculated.

The Pi values to give the required sampling times for equal intervals of $\int H dt$ can, of course, be precalculated when tthe shape of the intended $G_R$ pulse is known. The sampling times may then be stored in a read only memory (ROM) and used to control the sampling. The signal recovery and sampling system is shown in more detail in FIG. 10.

The signal sensing coil 6, shown schematically, is connected to the probe amplifier 18 by leads which will include suitable means (not shown) for isolating the amplifier from the $H_1$ drive amplifier which is also connected to coils 6. The amplifier signals are taken by suitable cabling 25 and transformers 26 to balanced demodulators 27. In this example the $G_R$ gradient has a zero at the centre of the body leading to double sidebands so that two balanced demodulators are required. They also have inputs of sine and Cos wt at the Larmor frequency set by $H_{zo}$ and $G_z$. The demodulated sine and cosine signal components are further applied via low pass filters 28 to analogue to digital convertors 29 where they are digitised for the processing at 17.

From transformers 26 to ADC's 29, the circuits of FIG. 10 comprise the signal handling circuits 19 of FIG. 7 and, as in FIG. 7, supply signals in suitable form for Fourier analysis and subsequent processing.

The ADC operates in a conventional manner and samples the analogue signal for a time which may be varied by a signal input at 30. This time then represents the sampling time which is required to be set for this invention. In this example the required times have been precalculated (or perhaps premeasured using a phantom body) and are held in ROM 31 from where they are applied in sequence to a comparator 32. This comparator compares each signal with clock pulses from a clock 33 until the required time is reached. It then provides a sample signal to ADC inputs 30 and interrogates ROM 31 for the next sample time.

It is also convenient to measure the field integral for the pulse, using the field probe system provided for other purposes. A sample can be taken every time a predetermined value is reached or the phase shifts can be counted to determine in real time when the required Pi is fulfilled to give the required sampling instant.

FIG. 11 shows a circuit using the output of a single such YIG probe Y although this may be replaced with weighted and combined outputs of several such probes. The probe supplies signals at frequency f(2.8 GH$_z$ for a 1kOe field) via a probe amplifier 23 to a mixer 34. The signals are then mixed with a signal at fo derived from a clock 35 to bring them to suitable frequencies for counting. Conveniently fo is chosen so that $\Delta f = f - fo$ is in the range 150-200 MHz.

In practice the YIG probes can oscillate in different modes and it is necessary to determine the mode in operation. For this purpose there are provided one or more NMR probes N. Such probes are simply miniature cells of pure water (for example closed test tubes) surrounded by small coils. An NMR probe gives a reliable resonance of 4.26 kHz/Oe and can be used to check the YIG probe modes. It is of insufficient spatial resonance to replace the YIG probes for all purposes although it could be used for the present invention to measure the field integral. Circuits 36 compare the NMR and YIG signals to determine mode corrections giving a correction factor k which is multiplied with the signal $\Delta f$ in a multiplier 37. The corrected frequency $k\Delta f$ is then counted in a counter 38 over a suitable period to yield $\int H dt$.

The value of $\int H dt$ is then output to the comparator 32 where it is compared with the output of ROM 31, in this case a single value of Hdt at which the sample in the ADC 29 should be taken.

The two procedures described may be combined so that a precalculated sampling time is prepared, and the system arranged to suit that time, but the actual time of sampling determined by field measurement.

It should be noted that it is preferable for the number of samples taken to be $2^p$ (where p is an integer). Otherwise O's may need to be added to the samples to make the number up to $2^p$ for Fourier processing.

What we claim is:

1. A nuclear magnetic resonance apparatus, for examining a slice of a body, the apparatus including:
   means for applying first magnetic fields to cause resonance preferentially in said slice;
   means for applying a further magnetic field which is pulsed and which has a gradient across the slice to produce phase dispersion in said resonance, the said means for applying the further field being arranged to cause a pulse, of said further, field whose rising and falling edges are not vertical; and
   means for sensing a resonance signal induced during said further field; wherein control means are provided for causing the means for sensing to sample the induced signal at intervals for each of which there is a field integral with respect to time for the further field such that the field integral is substantially the same in each interval between successive samples.

2. An apparatus according to claim 1 including means for sensing the magnetic field during the said pulsed field, means for determining the field integral and means for causing a sample to be taken at a predetermined value of the field integral.

3. An apparatus according to claim 1 including means for causing samples to be taken at predetermined times.

4. An apparatus according to claim 1 in which the means for applying a pulsed magnetic field is arranged to supply a field pulse of sinusoidal or distorted sinusoidal shape.

5. An apparatus according to claim 3 arranged to take $2^p$ samples in each said pulsed field, where p is an integer.

6. A method of examining a slice of a body by nuclear magnetic resonance, including the steps of: applying magnetic fields to induce resonance preferentially in a said slice, applying further magnetic fields, including a pulsed field having a gradient across the slice in one direction to cause phase dispersion of said resonance and sampling a resonance signal in the slice, wherein the gradient field pulse has rising and falling edges which are not vertical, and the resonance signal is sampled at intervals for each of which there is a field integral with respect to time for the pulsed gradient field such that the field integral is substantially the same in each of said intervals.

7. A method according to claim 6 in which the magnetic field is sensed during the pulsed field and samples taken when a predetermined value is reached.

8. A method according to claim 6 in which the magnetic field is sensed at times predetermined for the gradient field pulse shape to give the required equal field integrals.

9. A method according to any of claims 6, 7, or 8 in which the gradient field pulse shape is a sinusoid or distorted sinusoid.

10. A nuclear magnetic resonance apparatus, for examining a cross-sectional region of a body, the apparatus including:
    means for applying first magnetic fields to cause resonance preferentially in said region;
    means for applying a further magnetic field which is pulsed and which has a gradient across the region to produce phase dispersion in said resonance, the said means for applying the gradient field being arranged to cause a pulse whose amplitude varies from a constant level; and
    means for sensing a resonance signal induced during said pulsed gradient field; wherein control means are provided for causing the means for sensing to sample the induced signal at intervals such that the pulsed gradient field has a field integral with respect to time which is substantially the same in each interval between successive samples.

11. A nuclear magnetic resonance apparatus, for examining a region of a body, the apparatus including:
    means for applying first magnetic fields to cause resonance preferentially in said region;
    means for applying a further magnetic field having a gradient in a chosen direction in said region to produce phase dispersion in said resonance;
    means for sensing a resonance signal induced during the application of said gradient magnetic field; and
    control means for causing the means for sensing to sample the induced signal at intervals for each of which there is a field integral with respect to time of the gradient magnetic field such that the field integral is substantially the same in each interval between successive samples when the amplitude of the gradient magnetic field varies during said sampling.

12. An apparatus according to claim 11 including means for sensing the magnetic field during application of the gradient magnetic field, means for determining the field integral and means for causing a sample to be taken at a predetermined value of the field integral.

13. An apparatus according to claim 11 including means for causing samples to be taken at predetermined times.

14. A medical nuclear magnetic resonance apparatus, for examining a region of the body of a patient, the apparatus including:
means for applying first magnetic fields to cause resonance preferentially in said region;
means for applying a further magnetic field having a gradient in a chosen direction in said region to produce dispersion in said resonance;
means for sensing a resonance signal induced during the application of said gradient magnetic field;
means for sampling the induced signal at intervals, for each of which there is a field integral with respect to time of the gradient magnetic field such that the field integral is substantially the same in each interval between successive samples despite variations in the amplitude of the gradient magnetic field during a sampling interval or between different sampling intervals or both; and
means for processing the sampled resonance signal to yield an image of at least part of the region.

15. A method of examining a region of a body by means of nuclear resonance, the method including:
applying magnetic fields which combine to induce resonance preferentially in said region;
applying at least one further magnetic field having a gradient in a chosen direction in the region to cause phase dispersion of said resonance, and
sampling a resonance signal induced in the region in the presence of the gradient magnetic field, the sampling being arranged to be at intervals for each of which there is a field integral with respect to time of the gradient magnetic field such that the field integral is substantially the same in each of said intervals despite variations in the amplitude of the gradient magnetic field during said sampling.

16. A method according to claim 15 in which the magnetic field is sensed during the application of the gradient magnetic field and samples taken when a predetermined value of the said field integral is reached.

* * * * *